(12) United States Patent
Li et al.

(10) Patent No.: US 11,871,683 B2
(45) Date of Patent: Jan. 9, 2024

(54) CHARGING AND FIELD SUPPLEMENT CIRCUIT FOR SUPERCONDUCTING MAGNETS BASED ON PULSED CURRENT

(71) Applicant: SHANGHAI JIAO TONG UNIVERSITY, Shanghai (CN)

(72) Inventors: Xiaofen Li, Shanghai (CN); Zhiwei Zhang, Shanghai (CN); Zhijian Jin, Shanghai (CN); Yanbo Bi, Shanghai (CN)

(73) Assignee: SHANGHAI JIAO TONG UNIVERSITY, Shanghai (CN)

( * ) Notice: Subject to any disclaimer, the term of this patent is extended or adjusted under 35 U.S.C. 154(b) by 0 days.

(21) Appl. No.: 18/178,267

(22) Filed: Mar. 3, 2023

(65) Prior Publication Data
US 2023/0292634 A1 Sep. 14, 2023

Related U.S. Application Data

(63) Continuation of application No. PCT/CN2021/115522, filed on Aug. 31, 2021.

(51) Int. Cl.
*H10N 60/84* (2023.01)
*H01F 6/00* (2006.01)
(52) U.S. Cl.
CPC ............. *H10N 60/84* (2023.02); *H01F 6/008* (2013.01)
(58) Field of Classification Search
CPC ................................ H10N 60/84; H01F 6/008
(Continued)

(56) References Cited

U.S. PATENT DOCUMENTS 5,965,959 A * 10/1999 Gamble .................. H01F 6/005
335/216
2012/0014030 A1* 1/2012 Ichiki ........................ H01F 6/02
335/216

FOREIGN PATENT DOCUMENTS

CN 1874131 A 12/2006
CN 1988382 A 6/2007
(Continued)

OTHER PUBLICATIONS

Machine translation of Chen et al. Chinese Patent Document CN 102222983 A Oct. 19, 2011 (Year: 2011).*
(Continued)

*Primary Examiner* — Kevin J Comber

(57) ABSTRACT

A charging and field supplement circuit for superconducting magnets based on a pulsed current includes a capacitor charging circuit, an energy-storage capacitor, a capacitor discharging circuit, a superconducting magnetic energy storage circuit, and a superconducting persistent-current switch. Two output ends of the capacitor charging circuit are respectively connected to two ends of the energy-storage capacitor. Two input ends of the capacitor discharging circuit are respectively connected to the two ends of the energy-storage capacitor. Two output ends of the capacitor discharging circuit are respectively connected to two input ends of the superconducting magnetic energy storage circuit. Two output ends of the superconducting magnetic energy storage circuit are respectively connected to two input ends of the superconducting persistent-current switch. Two output ends of the superconducting persistent-current switch are configured to charge and magnetize a target superconducting magnet.

10 Claims, 1 Drawing Sheet

(58) Field of Classification Search
USPC .......................................................... 361/141
See application file for complete search history.

(56) References Cited

FOREIGN PATENT DOCUMENTS

| | | | | | |
|---|---|---|---|---|---|
| CN | 102055172 | A | | 5/2011 | |
| CN | 102222983 | A | * | 10/2011 | |
| CN | 102222983 | A | | 10/2011 | |
| CN | 105794006 | A | | 7/2016 | |
| CN | 107947573 | A | | 4/2018 | |
| JP | 2004296974 | A | * | 10/2004 | |
| JP | 2004343869 | A | | 12/2004 | |
| WO | WO-2017021674 | A1 | * | 2/2017 | ............ H01F 6/006 |
| WO | WO-2017037259 | A1 | * | 3/2017 | |

OTHER PUBLICATIONS

Machine translation of Arndt et al. International Patent Document WO 2017037259 A1 Mar. 9, 2017 (Year: 2017).*
Machine translation of Dobashi et al. Japanese Patent Document JP 2004-296974 A Oct. 21, 2004 (Year: 2004).*
Jingbo Lin et al., "Magnetic-Controlled Persistent Current Switch Based on the Model of Dynamic Resistance", Low Temperature Physical Letters, No. 4, 2019, pp. 272-277.

* cited by examiner

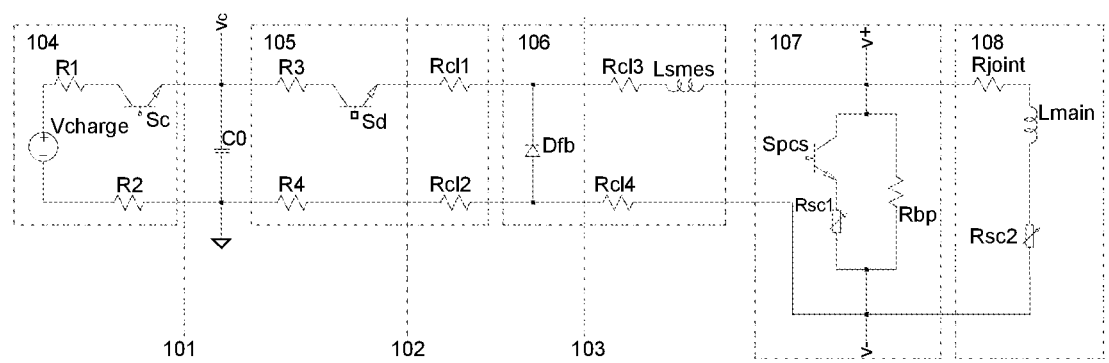

CHARGING AND FIELD SUPPLEMENT CIRCUIT FOR SUPERCONDUCTING MAGNETS BASED ON PULSED CURRENT

CROSS-REFERENCE TO RELATED APPLICATION

This application is a continuation of International Patent Application No. PCT/CN2021/115522, filed on Aug. 31, 2021, which claims the benefit of priority from Chinese Patent Application No. 202011157883.9, filed on Oct. 26, 2020. The content of the aforementioned application, including any intervening amendments thereto, is incorporated herein by reference in its entirety.

TECHNICAL FIELD

This application relates to charging circuits, and more particularly to a charging and field supplement circuit for superconducting magnets based on a pulsed current.

BACKGROUND

The application of superconducting magnets for energy storage in power systems was first proposed by Ferrier in 1969, aimed to regulate the load change of the power system in France. In 1974, the first applicable superconducting magnetic energy storage system with a three-phase inverter was developed by the Los Alamos National Laboratory in the United States. In the superconducting magnetic energy storage system, the energy is stored by using the magnetic field generated by the direct current of the superconducting coil. In order to reduce the energy loss, the energy storage coil is made of a superconducting material and immersed in liquid nitrogen or helium. The fabrication and cooling techniques play a key role in the development and application of superconducting coils.

Chinese patent No. 102055172B discloses an excitation power supply for superconducting magnets and its operation method. However, these traditional excitation power supplies are heavy and bulky, and their current leads suffer serious heat leakage.

SUMMARY

In view of the deficiencies in the prior art, this application provides a charging and field supplement circuit for superconducting magnets based on a pulsed current.

In a first aspect, this application provides a charging and field supplement circuit for superconducting magnets based on a pulsed current, comprising:

a capacitor charging circuit;
an energy-storage capacitor;
a capacitor discharging circuit;
a superconducting magnetic energy storage circuit; and
a superconducting persistent-current switch;

wherein a first output end of the capacitor charging circuit is connected to a first end of the energy-storage capacitor, and a second output end of the capacitor charging circuit is connected to a second end of the energy-storage capacitor; a first input end of the capacitor discharging circuit is connected to the first end of the energy-storage capacitor, and a second input end of the capacitor discharging circuit is connected to the second end of the energy-storage capacitor; a first output end of the capacitor discharging circuit is connected to a first input end of the superconducting magnetic energy storage circuit, and a second output end of the capacitor discharging circuit is connected to a second input end of the superconducting magnetic energy storage circuit; a first output end of the superconducting magnetic energy storage circuit is connected to a first input end of the superconducting persistent-current switch, and a second output end of the superconducting magnetic energy storage circuit is connected to a second input end of the superconducting persistent-current switch; and two output ends of the superconducting persistent-current switch are configured to charge and magnetize a target superconducting magnet; and a lower temperature boundary of the charging and field supplement circuit is located between the energy-storage capacitor and the capacitor charging circuit, in the capacitor discharging circuit, or in the superconducting magnetic energy storage circuit.

In an embodiment, the capacitor charging circuit includes a charging power supply, a resistor $R_1$, a resistor $R_2$ and a charging switch; and a positive electrode of the charging power supply is connected to the charging switch through the resistor $R_1$; a negative electrode of the charging power supply is connected to the resistor $R_2$; and the charging switch is connected to the first end of the energy-storage capacitor, and the resistor $R_2$ is connected to the second end of the energy-storage capacitor.

In an embodiment, the capacitor discharging circuit includes a resistor $R_3$, a resistor $R_4$, a discharging switch, a resistor Rai, and a resistor $R_{c12}$;

the resistor $R_3$, the discharging switch and the resistor Rai are connected in series between the capacitor charging circuit and the superconducting magnetic energy storage circuit; and the resistor $R_4$ and the resistor $R_{c12}$ are connected in series between the capacitor charging circuit and the superconducting magnetic energy storage circuit.

In an embodiment, the superconducting magnetic energy storage circuit includes a freewheeling diode, a resistor $R_{c13}$, a resistor $R_{c14}$, and a superconducting magnetic energy storage device;

the resistor $R_{c13}$ and the superconducting magnetic energy storage device are connected in series between the capacitor discharging circuit and the superconducting persistent-current switch;

the resistor $R_{c14}$ is connected in series between the capacitor discharging circuit and the superconducting persistent-current switch; and one end of the freewheeling diode is connected between the capacitor discharging circuit and the resistor $R_{c13}$, and the other end of the freewheeling diode is connected between the capacitor discharging circuit and the resistor $R_{c14}$.

In an embodiment, the superconducting persistent-current switch is represented by a switch $S_{pcs}$, a variable resistor $R_{sc1}$, and a bypass resistor $R_{bp}$;

an emitter of the switch S pcs is connected to a first end of the variable resistor $R_{sc1}$, and the bypass resistor $R_{bp}$ is connected in parallel with the switch $S_{pcs}$ and the variable resistor $R_{sc1}$;

a collector of the switch $S_{pcs}$ is connected to the first output end of the superconducting magnetic energy storage circuit; and a second end of the variable resistor $R_{sc1}$ is connected to the second output end of the superconducting magnetic energy storage circuit.

In an embodiment, the charging and field supplement circuit further includes a superconducting magnet accommodating portion;
    wherein the target superconducting magnet is provided in the superconducting magnet accommodating portion;
    the superconducting magnet accommodating portion comprises a joint resistor $R_{joint}$ and a variable resistor $R_{sc2}$;
    one end of the joint resistor $R_{joint}$ is connected to the superconducting persistent-current switch, and the other end of the joint resistor $R_{joint}$ is connected to the target superconducting magnet; and
    one end of the variable resistor $R_{sc2}$ is connected to the superconducting persistent-current switch, and the other end of the variable resistor $R_{sc2}$ is connected to the target superconducting magnet.

In an embodiment, the target superconducting magnet includes a target superconducting coil $L_{main}$.

In an embodiment, in a capacitor discharge cycle, the capacitor charging circuit is in a connected or disconnected state, and the capacitor discharging circuit is in a connected state; and
    in a capacitor charge cycle, the capacitor charging circuit is in a connected state, and the capacitor discharging circuit is in a disconnected state.

In a second aspect, this application provides another charging and field supplement circuit for superconducting magnets, including:
    a capacitor charging circuit;
    an energy-storage capacitor;
    a capacitor discharging circuit; and
    a superconducting persistent-current switch;
    wherein a first output end of the capacitor charging circuit is connected to a first end of the energy-storage capacitor, and a second output end of the capacitor charging circuit is connected to a second end of the energy-storage capacitor;
    a first input end of the capacitor discharging circuit is connected to the first end of the energy-storage capacitor, and a second input end of the capacitor discharging circuit is connected to the second end of the energy-storage capacitor;
    a first output end of the capacitor discharging circuit is connected to a first input end of the superconducting persistent-current switch, and a second output end of the capacitor discharging circuit is connected to a second input end of the superconducting persistent-current switch;
    two output ends of the superconducting persistent-current switch are configured to charge and magnetize a target superconducting magnet; and
    a lower temperature boundary of the charging and field supplement circuit is located between the energy-storage capacitor and the capacitor charging circuit, or in the capacitor discharging circuit.

In a third aspect, this application provides another charging and field supplement circuit for superconducting magnets, including:
    a capacitor charging circuit;
    an energy-storage capacitor;
    a capacitor discharging circuit; and
    a superconducting magnetic energy storage circuit;
    wherein a first output end of the capacitor charging circuit is connected to a first end of the energy-storage capacitor, and a second output end of the capacitor charging circuit is connected to a second end of the energy-storage capacitor;
    a first input end of the capacitor discharging circuit is connected to the first end of the energy-storage capacitor, and a second input end of the capacitor discharging circuit is connected to the second end of the energy-storage capacitor;
    a first output end of the capacitor discharging circuit is connected to a first input end of the superconducting magnetic energy storage circuit, and a second output end of the capacitor discharging circuit is connected to a second input end of the superconducting magnetic energy storage circuit;
    two output ends of the superconducting magnetic energy storage circuit are configured to charge and magnetize a target superconducting magnet; and
    a lower temperature boundary of the charging and field supplement circuit is located between the energy-storage capacitor and the capacitor charging circuit, in the capacitor discharging circuit, or in the superconducting magnetic energy storage circuit.

Compared to the prior art, this application has the following beneficial effects.

This application can charge and magnetize the superconducting magnet. The charging and field supplement circuit provided herein greatly reduces the volume of the charging device and the cross-section of the current lead. Based on the charging and field supplement circuit, a primary charging power supply or excitation power supply with light weight and low heat leakage can be fabricated.

Based on the pulsed current charging structure, this application provides a technical solution of miniaturizing the power supply for excitation and magnetic supplementation of the superconducting magnet and thinning/lengthening the current lead, facilitating overcoming the defects in the prior art that the excitation power supply for superconducting magnets has large size and weight, and the current lead suffers serious heat leakage. This application provides a portable and lightweight excitation power supply for superconducting magnets.

BRIEF DESCRIPTION OF THE DRAWINGS

Other features, objects and advantages of the present disclosure will become more apparent through the detailed description of embodiments with reference to the following drawings.

The FIGURE schematically shows a structure of a charging and field supplement circuit for superconducting magnets according to one embodiment of the present disclosure.

DETAILED DESCRIPTION OF EMBODIMENTS

The present disclosure will be described in detail below with reference to embodiments, which are not intended to limit the disclosure. It should be understood that any modifications and replacements made by those skilled in the art without departing from the spirit of the disclosure should fall within the scope of the disclosure defined by the present claims.

An embodiment of the present disclosure provides a charging and field supplement circuit, which includes a capacitor charging circuit 104, an energy-storage capacitor $C_0$, a capacitor discharging circuit 105, a superconducting magnetic energy storage circuit 106, a superconducting persistent-current switch 107 and a superconducting magnet accommodating portion 108. The superconducting magnetic energy storage circuit 106 includes a freewheeling diode $D_{fb}$ and a superconducting magnetic energy storage device $L_{smes}$. As shown in the FIGURE, the energy is sequentially transferred from the power source, the energy-storage capacitor $C_0$, the superconducting magnetic energy storage device $L_{smes}$, and finally to the superconducting magnet accommodating portion 108 from left to right. Among them, the charging and field supplement circuit includes some important components, for example, the energy-storage capacitor $C_0$, the superconducting magnetic energy storage device $L_{smes}$, the freewheeling diode $D_{fb}$, a superconducting persistent-current switch $S_{pcs}$, a variable resistor $R_{sc1}$, a bypass resistor $R_{bp}$, and a target superconducting coil $L_{main}$ including a joint resistor $R_{joint}$ and a variable resistance $R_{sc2}$.

The working principle of the charging and field supplement circuit is described as follows.

The charging and field supplement circuit adopts a representative periodic pulse mode. A working cycle includes a capacitor discharge cycle and a capacitor charge cycle, the capacitor discharge cycle accounts for less than 10% of the total working cycle, and the rest is the capacitor charge cycle. During the capacitor discharge cycle, the charging switch $S_c$ keeps open or closed, the discharging switch $S_d$ is closed, and the electrical energy stored in the energy-storage capacitor $C_0$ is released to the superconducting magnetic energy storage device $L_{smes}$ through the discharge circuit boundary 102, and $L_{smes}$ will continue to charge the superconducting magnet accommodating portion 108 over a period of time which may include one discharge cycle and a period of time after the discharge cycle. At this time, the superconducting persistent-current switch 107 is in a non-superconducting state which can provide voltage for the superconducting magnet accommodating portion 108. After the discharge cycle ends, the charging and field supplement circuit enters the capacitor charge cycle, the charging switch $S_c$ is closed, and the discharging switch $S_d$ is opened, at this time, the power supply will continue to supply energy to the energy-storage capacitor $C_0$. At the same time, due to the freewheeling diode $D_{fb}$ in the superconducting magnetic energy storage circuit 106, the superconducting magnetic energy storage device $L_{smes}$ will hold current, and the energy stored in the superconducting magnetic energy storage device $L_{smes}$ in the form of magnetic field energy will continue to be released to the target superconducting coil $L_{main}$ for a period of time, until the current is less than the current in the target superconducting coil $L_{main}$. At this time, the superconducting persistent-current switch $S_{pcs}$ is in a superconducting state, and the current in the target superconducting coil will continue to flow without attenuation.

The charging greatly reduces the demand for the output current of the power supply and the demand for the current lead across the lower temperature boundary. The main purpose of this charging and field supplement circuit is to use a low-current, high-voltage power supply to reduce the volume of the power supply and to use a high-resistance current lead to reduce the heat leakage of the current lead.

Form 1: Freewheeling Diode Circuit

As shown in the FIGURE, if the inductance value of the superconducting magnetic energy storage device $L_{smes}$ in the superconducting magnetic energy storage circuit 106 is 0, $R_{bp}$ in the superconducting persistent-current switch 107 is infinite, and $S_{pcs}$ keeps open, the charging and field supplement circuit becomes a simple pulse coil charging circuit, that is, the freewheeling diode circuit. In this circuit, in the capacitor discharge cycle, the energy-storage capacitor $C_0$ charges the superconducting coil. After discharge, all the current in the superconducting coil passes through the freewheeling diode, and the energy is continuously consumed by the forward resistance of the freewheeling diode.

Unfortunately, the working mode in the form of a freewheeling diode has three main problems. 1. The voltage and current requirements of the DC power supply are relatively high, and the upper limit of the current in the coil is limited by the DC power supply. 2. The coil cannot work in a closed loop. 3. Joule heating on freewheeling diode is large and always generated. But the advantage is that it can charge faster.

Form 2: Superconducting Persistent-Current Switch Circuit

The superconducting persistent current switch (PCS) is the standard solution for the persistent current mode for superconducting magnets. A PCS usually includes a section of superconductor, which can be manipulated between superconducting and normal (resistive) states through heat, magnetic field, dynamic resistance or over current. The PCS is represented by an equivalent circuit in superconducting persistent-current switch 107 in the FIGURE, the target superconducting magnet needs to be charged, where the switch $S_{pcs}$ is off, or the variable resistor $R_{sc1}$ is in a high-impedance state, thereby providing a parallel resistance for the superconducting magnet accommodating portion 108. After finish charging, where the switch $S_{pcs}$ is on, and the variable resistor $R_{sc1}$ is in a non-impedance state, thus the non-impedance superconducting loop provides a closed circuit for the superconducting magnet accommodating portion 108.

In the working cycle of the pulse power supply, the superconducting persistent current switch needs to cooperate with the charging and discharging of the power supply circuit at high speed and be in a high-impedance state in each capacitor discharge cycle and the subsequent freewheeling cycle; and in each capacitor charge cycle, the superconducting persistent current switch is in a non-impedance state, so that the current in the superconducting coil does not decay with time. After the magnetization or supplementary magnetization is completed, the superconducting persistent current switch is in a non-impedance state, and the superconducting coil enters the passive closed mode.

2.1 Circuit without a Superconducting Magnetic Energy Storage Circuit

If the superconducting magnetic energy storage circuit 106 is removed in the FIGURE and replaced with a wire, the new circuit is equivalent to a common PCS switch superconducting magnetic charging circuit except that in the pulse mode. During charging, the PCS switch is opened, and after charging is finished, the PCS switch is closed. Usually, the PCS switch is turned on or off by heating.

However, in a pulse magnetization circuit, the switching frequency of the PCS switch is much higher than in normal operation. Such an operating frequency cannot often be achieved using a temperature-controlled PCS by heating and cooling. Instead, the switching frequency of the PCS switch is done by a current-controlled switch or a magnetic switch PCS, that is, the PCS switch is controlled by applying a DC magnetic field higher than the irreversible field to from a flux flow resistance, or applying an alternating magnetic field to form dynamic resistance to produce resistance to the superconducting wire, or by a large current that exceeds the critical current of the superconductor to bring resistance to the superconducting wire. In this application, the current control method is preferably used, because for the pulse current, the large current exceeding the critical current of the superconductor can be easily obtained without considering the time synchronization between the magnetic field and the pulse current. However, the magnetic switch PCS is also workable.

For the current-controlled PCS switch, it is a preferred solution to leave a section at the end of the wire of the target superconducting coil and provide a heating device on this section of the wire and ensures thermal insulation to the heating device. Specifically, the thermal insulation depends on the reaction speed and heating power of the heating device, good thermal insulation leads to a low reaction speed, and poor high heating power leads to too high heating power. During the working process, the temperature of the PCS circuit portion is adjusted according to the charging state, so that the critical current of the PCS circuit portion is just higher than the current I of the target superconducting coil, thereby achieving the best charging effect. During the charging process, while the capacitor discharge current, which is the current sum $I_{D(t)}$ of the current in the PCS circuit portion and the current in the superconducting coil, is higher than 2I, the current on the PCS circuit portion will exceed the critical current I, and a voltage generates across the PCS circuit portion, and the target superconducting coil starts to be charged. After the capacitor discharge is finished, the current on the target superconducting coil can pass through the PCS circuit portion in the reverse direction without decay. As the current on the target superconducting coil is gradually increased, the temperature of the PCS circuit portion is gradually lowered, its critical current of the PCS circuit portion always maintains just higher than the current on the target superconducting coil. During the entire charging process, the capacitor discharge current is maximized.

The advantage of such a circuit is that a small DC power supply can achieve the purpose. For example, with a 5V2A mobile phone charging power supply or other small charging power supply with QC or PD protocol or with higher current or voltage, discharge current of more than 1kA can be achieved to provide magnetization or supplementary magnetization for the superconducting magnet coil. However, such a circuit also has limitations, for example mainly in that the effective charge cycle is too short (the duty cycler η is too small), resulting in the too slow charging speed.

2.2 Circuit with a Superconducting Magnetic Energy Storage Coil

In view of two slow charging speed, a superconducting magnetic energy storage (SMES) coil and a freewheeling diode device representing the superconducting magnetic energy storage circuit 106 are introduced into the PCS circuit. Such an arrangement is to store the discharge energy of the energy-storage capacitor and to continue to magnetize the target superconducting coil in a short freewheeling period after the capacitor discharge cycle ends. For the working current and voltage of the DC power supply, target coil inductance, capacitance, and target magnetizing current, there is a corresponding selection of preferred inductance of the superconducting magnetic energy storage coil, operating frequency and duty cycle.

In the practical application, the critical current of the SMES should be significantly higher than the target superconducting coil. For example, an inductance of 0.5 μH is approximately corresponded to a three turns superconducting coil with an outer diameter of 50 mm, or a four turns superconducting coil with an outer diameter of 30 mm. Since it is easy to change its size of the superconducting coil, multiple superconducting wires are winded in parallel connection to increase the critical current.

Lower Temperature Boundary

Depending on the difficulty of operating the low-temperature capacitor and the low-temperature switch, and the heat generation of the freewheeling diode, the lower temperature boundary can be the capacitor charging circuit boundary 101, the capacitor discharging circuit boundary 102, or the freewheeling diode circuit boundary 103. If a suitable low temperature energy-storage capacitor $C_0$ and low temperature discharging switch $S_d$ can be found, the circuit portion on the right of capacitor charging circuit boundary 101 can be arranged under the low temperature side; otherwise, the circuit portion on the right of the capacitor discharging circuit boundary 102 can be arranged under the low temperature side, and the circuit portion on the left of the capacitor discharging circuit boundary 102 can be arranged under the high temperature side. The freewheeling diode $D_{fb}$ in the superconducting magnetic energy storage circuit 106 can also be arranged under on the high temperature side, that is, the lower temperature boundary is arranged at the freewheeling diode circuit boundary 103, which can prevent the Joule heat of the freewheeling diode from releasing towards the low temperature side. The selection of lower temperature boundary is mainly based on the realization difficulty of low temperature components, heat generation and heat leakage. Based on the charge balance, $\int I_d dt = \int I_c dt$, and $\int I_d^2 dt > \int I_c^2 dt$ is further obtained. This ratio is approximately equal to the reciprocal of the duty cycle 1/η, in other words, the heating per unit resistance on the capacitor discharging circuit boundary 102 is greater than the capacitor charging circuit boundary 101. Therefore, according to wire heating, the capacitor charging circuit boundary 101 is the most suitable as the lower temperature boundary. If the freewheeling diode circuit boundary 103 is arranged as the lower temperature boundary, due to the freewheeling device, the time when high current is passed on the freewheeling diode circuit boundary 103 exceeds the time when high current is passed on the capacitor discharging circuit boundary 102, so the wire heats more seriously. When selecting the current lead, if the Joule heat in the capacitor charging circuit boundary 101, the capacitor discharging circuit boundary 102, or the freewheeling diode circuit boundary 103 is the same, the thermal resistance is R101>R102>R103, so the heat leakage of the capacitor charging circuit boundary 101 is the smallest.

If Joule heating on the freewheeling diode is considered, the lower temperature boundary is arranged at the freewheeling diode circuit boundary 103, the Joule heating of the freewheeling diode has the least effect on the circuit. According to the actual situation, the lower temperature boundary can choose any one of the three cases.

Comparing with the above circuit structures and combining different low temperature boundaries, the characteristics of various circuit structures are listed in Tables 1 and 2 below. The combination of the above circuit structures and the lower temperature boundary can be selected according to the actual requirements.

TABLE 1 characteristics of several magnetizing circuits

| | Freewheeling diode circuit | PCS without SMES | PCS + SMES |
|---|---|---|---|
| Charging speed | Fast | Slow | Relatively fast |
| Energy consumption (heat) | High | Low | Relatively high |
| Passive closed operation | No | Yes | yes |
| Joule Heating of Diode | High (high DC power) | None (no diode) | Relatively high |

TABLE 2 characteristics of different low temperature boundaries

|  | 101 | 102 | 103 |
|---|---|---|---|
| Capacitor with low temperature | Required | Not Required | Not Required |
| Discharge switch with low temperature and high current | Required | Not Required | Not Required |
| Diode with low temperature, high current, and low resistance | Required | Required | Not Required |
| Joule Heat/Resistance of Current Lead | Low | High | Highest |
| Conduction leakage of current lead | Low | High | Highest |
| Joule Heating of Diode | Released at low temperature side | Released at low temperature side | Released at high temperature side |

For example, the circuit with PCS, SMES and the freewheeling diode circuit boundary 103 has the advantages of fast charging rate and passive operation, and diode Joule heat is released on the high temperature side, etc., but it needs to be equipped with current leads with lower resistance, resulting in large heat leakage.

As used herein, it should be understood that the orientation or positional relationship indicated by the terms "upper", "lower", "front", "rear", "left", "right", "vertical", "horizontal", "top", "bottom", "inside", and "outside" is based on the orientation or positional relationship shown in the accompanying drawings, which is only for the convenience of describing the technical solutions and simplifying the description, rather than indicating or implying that the indicated device or element must have a specific orientation, be constructed or operated in a specific orientation. Therefore, these terms should not be understood as a limitation of the present disclosure.

Described above are merely preferred embodiments of the disclosure, which are not intended to limit the disclosure. It should be understood that any modifications and replacements made by those skilled in the art without departing from the spirit of the disclosure should fall within the scope of the disclosure defined by the present claims.

What is claimed is:

1. A charging and field supplement circuit for superconducting magnets, comprising:
    a capacitor charging circuit;
    an energy-storage capacitor;
    a capacitor discharging circuit;
    a superconducting magnetic energy storage circuit; and
    a superconducting persistent-current switch;
    wherein a first output end of the capacitor charging circuit is connected to a first end of the energy-storage capacitor, and a second output end of the capacitor charging circuit is connected to a second end of the energy-storage capacitor; a first input end of the capacitor discharging circuit is connected to the first end of the energy-storage capacitor, and a second input end of the capacitor discharging circuit is connected to the second end of the energy-storage capacitor; a first output end of the capacitor discharging circuit is connected to a first input end of the superconducting magnetic energy storage circuit, and a second output end of the capacitor discharging circuit is connected to a second input end of the superconducting magnetic energy storage circuit; a first output end of the superconducting magnetic energy storage circuit is connected to a first input end of the superconducting persistent-current switch, and a second output end of the superconducting magnetic energy storage circuit is connected to a second input end of the superconducting persistent-current switch; and two output ends of the superconducting persistent-current switch are configured to charge and magnetize a target superconducting magnet; and
    a lower temperature boundary of the charging and field supplement circuit is located between the energy-storage capacitor and the capacitor charging circuit, in the capacitor discharging circuit, or in the superconducting magnetic energy storage circuit.

2. The charging and field supplement circuit of claim 1, wherein the capacitor charging circuit comprises a charging power supply, a resistor $R_1$, a resistor $R_2$ and a charging switch; and
    a positive electrode of the charging power supply is connected to the charging switch through the resistor $R_1$; a negative electrode of the charging power supply is connected to the resistor $R_2$; and the charging switch is connected to the first end of the energy-storage capacitor, and the resistor $R_2$ is connected to the second end of the energy-storage capacitor.

3. The charging and field supplement circuit of claim 1, wherein the capacitor discharging circuit comprises a resistor $R_3$, a resistor $R_4$, a discharging switch, a resistor $R_{c11}$, and a resistor $R_{c12}$;
    the resistor $R_3$, the discharging switch and the resistor $R_{c11}$ are connected in series between the capacitor charging circuit and the superconducting magnetic energy storage circuit; and
    the resistor $R_4$ and the resistor $R_{c12}$ are connected in series between the capacitor charging circuit and the superconducting magnetic energy storage circuit.

4. The charging and field supplement circuit of claim 1, wherein the superconducting magnetic energy storage circuit comprises a freewheeling diode, a resistor $R_{c13}$, a resistor $R_{c14}$, and a superconducting magnetic energy storage device;
    the resistor $R_{c13}$ and the superconducting magnetic energy storage device are connected in series between the capacitor discharging circuit and the superconducting persistent-current switch;
    the resistor $R_{c14}$ is connected in series between the capacitor discharging circuit and the superconducting persistent-current switch; and
    one end of the freewheeling diode is connected between the capacitor discharging circuit and the resistor $R_{c13}$, and the other end of the freewheeling diode is connected between the capacitor discharging circuit and the resistor $R_{c14}$.

5. The charging and field supplement circuit of claim 1, wherein the superconducting persistent-current switch is represented by a switch $S_{pcs}$, a variable resistor $R_{sc1}$, and a bypass resistor $R_{bp}$;
    an emitter of the switch S pcs is connected to a first end of the variable resistor $R_{sc1}$, and the bypass resistor $R_{bp}$ is connected in parallel with the switch $S_{pcs}$ and the variable resistor $R_{sc1}$;
    a collector of the switch $S_{pcs}$ is connected to the first output end of the superconducting magnetic energy storage circuit; and
    a second end of the variable resistor $R_{sc1}$ is connected to the second output end of the superconducting magnetic energy storage circuit.

6. The charging and field supplement circuit of claim 1, further comprising:

a superconducting magnet accommodating portion;

wherein the target superconducting magnet is provided in the superconducting magnet accommodating portion;

the superconducting magnet accommodating portion comprises a joint resistor $R_{joint}$ and a variable resistor $R_{sc2}$;

one end of the joint resistor $R_{joint}$ is connected to the superconducting persistent-current switch, and the other end of the joint resistor $R_{joint}$ is connected to the target superconducting magnet; and one end of the variable resistor $R_{sc2}$ is connected to the superconducting persistent-current switch, and the other end of the variable resistor $R_{sc2}$ is connected to the target superconducting magnet.

7. The charging and field supplement circuit of claim 1, wherein the target superconducting magnet comprises a target superconducting coil $L_{main}$.

8. The charging and field supplement circuit of claim 1, wherein in a capacitor discharge cycle, the capacitor charging circuit is in a connected or disconnected state, and the capacitor discharging circuit is in a connected state; and in a capacitor charge cycle, the capacitor charging circuit is in a connected state, and the capacitor discharging circuit is in a disconnected state.

9. A charging and field supplement circuit for superconducting magnets, comprising:

a capacitor charging circuit;

an energy-storage capacitor;

a capacitor discharging circuit; and a superconducting persistent-current switch;

wherein a first output end of the capacitor charging circuit is connected to a first end of the energy-storage capacitor, and a second output end of the capacitor charging circuit is connected to a second end of the energy-storage capacitor;

a first input end of the capacitor discharging circuit is connected to the first end of the energy-storage capacitor, and a second input end of the capacitor discharging circuit is connected to the second end of the energy-storage capacitor;

a first output end of the capacitor discharging circuit is connected to a first input end of the superconducting persistent-current switch, and a second output end of the capacitor discharging circuit is connected to a second input end of the superconducting persistent-current switch;

two output ends of the superconducting persistent-current switch are configured to charge and magnetize a target superconducting magnet; and a lower temperature boundary of the charging and field supplement circuit is located between the energy-storage capacitor and the capacitor charging circuit, or in the capacitor discharging circuit.

10. A charging and field supplement circuit for superconducting magnets, comprising:

a capacitor charging circuit;

an energy-storage capacitor;

a capacitor discharging circuit; and a superconducting magnetic energy storage circuit;

wherein a first output end of the capacitor charging circuit is connected to a first end of the energy-storage capacitor, and a second output end of the capacitor charging circuit is connected to a second end of the energy-storage capacitor;

a first input end of the capacitor discharging circuit is connected to the first end of the energy-storage capacitor, and a second input end of the capacitor discharging circuit is connected to the second end of the energy-storage capacitor;

a first output end of the capacitor discharging circuit is connected to a first input end of the superconducting magnetic energy storage circuit, and a second output end of the capacitor discharging circuit is connected to a second input end of the superconducting magnetic energy storage circuit;

two output ends of the superconducting magnetic energy storage circuit are configured to charge and magnetize a target superconducting magnet; and a lower temperature boundary of the charging and field supplement circuit is located between the energy-storage capacitor and the capacitor charging circuit, in the capacitor discharging circuit, or in the superconducting magnetic energy storage circuit.

\* \* \* \* \*